(12) United States Patent
Bae et al.

(10) Patent No.: US 11,342,239 B2
(45) Date of Patent: May 24, 2022

(54) SEMICONDUCTOR PACKAGE

(71) Applicant: SAMSUNG ELECTRONICS CO., LTD., Suwon-si (KR)

(72) Inventors: Sunghawn Bae, Suwon-si (KR); Doohwan Lee, Suwon-si (KR); Jooyoung Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 170 days.

(21) Appl. No.: 16/672,652

(22) Filed: Nov. 4, 2019

(65) Prior Publication Data
US 2020/0152535 A1    May 14, 2020

(30) Foreign Application Priority Data
Nov. 9, 2018  (KR) .................. 10-2018-0137526

(51) Int. Cl.
| | |
|---|---|
| *H01L 23/367* | (2006.01) |
| *H01L 23/31* | (2006.01) |
| *H01L 21/48* | (2006.01) |
| *H01L 23/498* | (2006.01) |
| *H01L 23/00* | (2006.01) |
| *H01L 23/373* | (2006.01) |

(52) U.S. Cl.
CPC ...... *H01L 23/3135* (2013.01); *H01L 21/4846* (2013.01); *H01L 23/367* (2013.01); *H01L 23/3736* (2013.01); *H01L 23/49827* (2013.01); *H01L 24/25* (2013.01); *H01L 2224/25171* (2013.01)

(58) Field of Classification Search
CPC ............. H01L 21/4882; H01L 23/3135; H01L 23/34–3738; H01L 23/498; H01L 23/49822; H01L 23/522; H01L 2023/4068
See application file for complete search history.

(56) References Cited

U.S. PATENT DOCUMENTS

| | | | |
|---|---|---|---|
| 9,330,994 B2 | 5/2016 | Camacho et al. | |
| 9,576,930 B2 | 2/2017 | Tseng et al. | |

(Continued)

FOREIGN PATENT DOCUMENTS

| | | | |
|---|---|---|---|
| KR | 20040043889 A | * | 5/2004 |
| KR | 10-2018-0037406 A | | 4/2018 |

OTHER PUBLICATIONS

Machine translation of KR 20040043889 A (Year: 2004).*

*Primary Examiner* — Bryan R Junge
(74) *Attorney, Agent, or Firm* — Sughrue Mion, PLLC

(57) ABSTRACT

The invention provides a semiconductor package, which may include a connection structure including one or more redistribution layers. A semiconductor chip is disposed on the connection structure and has an active surface on which a connection pad electrically connected to the redistribution layer is disposed and an inactive surface opposite to the active surface. An encapsulant is disposed on the connection structure and covers at least a portion of the inactive surface of the semiconductor chip. A conductor pattern layer is embedded in the encapsulant such that one exposed surface of the conductor pattern layer is exposed from the encapsulant. A metal layer is disposed on the encapsulant and covers the one exposed surface of the conductor pattern layer.

15 Claims, 16 Drawing Sheets

(56) References Cited

U.S. PATENT DOCUMENTS

| | | | |
|---|---|---|---|
| 2002/0100969 A1* | 8/2002 | Farquhar | H01L 23/3128 257/717 |
| 2005/0045369 A1* | 3/2005 | Ishimaru | H01L 23/4334 174/250 |
| 2006/0244148 A1* | 11/2006 | Lu | H01L 21/4871 257/772 |
| 2011/0244636 A1* | 10/2011 | Kondo | H01L 23/49822 438/127 |
| 2012/0098115 A1* | 4/2012 | Watanabe | H01L 25/0657 257/690 |
| 2015/0034374 A1* | 2/2015 | Shimizu | H01L 24/83 174/257 |
| 2016/0336249 A1* | 11/2016 | Kang | H01L 23/552 |
| 2017/0287839 A1* | 10/2017 | Lee | H01L 23/5383 |
| 2017/0373030 A1* | 12/2017 | Lee | H01L 24/05 |
| 2018/0096927 A1 | 5/2018 | Kim et al. | |
| 2019/0067157 A1* | 2/2019 | Lin | H01L 23/42 |
| 2019/0139854 A1* | 5/2019 | Wu | H01L 23/53295 |
| 2019/0237373 A1* | 8/2019 | Huang | H01L 24/16 |
| 2020/0020605 A1* | 1/2020 | Otsubo | H01L 23/5386 |

* cited by examiner

SEMICONDUCTOR PACKAGE

CROSS-REFERENCE TO RELATED APPLICATION

This application claims benefit of priority to Korean Patent Application No. 10-2018-0137526 filed on Nov. 9, 2018 in the Korean Intellectual Property Office, the disclosure of which is incorporated herein by reference in its entirety.

BACKGROUND

The present disclosure relates to a semiconductor package, for example, a fan-out semiconductor package capable of extending an electrical connection structure beyond an area in which a semiconductor chip is disposed.

One of the main trends in technology development related to semiconductor chips in recent years is to reduce a size of components. Therefore, in the field of packaging, efforts have been made to implement a large number of pins and to have a small size in accordance with a surge of demand for small semiconductor chips and the like.

To meet this need, one of the proposed semiconductor package technologies is a fan-out semiconductor package. The fan-out semiconductor package may redistribute an electrical connection structure beyond an area on which a semiconductor chip is disposed, thereby enabling a large number of pins to be implemented while maintaining a small size.

SUMMARY

An aspect of the present disclosure is to provide a semiconductor package which may be excellent in heat dissipation characteristics and reliability, may have warpage control and electromagnetic shielding effects, and may improve yield of a semiconductor chip.

An aspect of the present disclosure is to introduce a heat dissipating structure, at least a portion of which is embedded in an encapsulant, into the encapsulant for encapsulating the semiconductor chip.

According to an aspect of the present disclosure, a semiconductor package includes a connection structure including one or more redistribution layers, a semiconductor chip disposed on the connection structure and having an active surface on which a connection pad electrically connected to the redistribution layer is disposed and an inactive surface opposite to the active surface, and an encapsulant disposed on the connection structure and covering at least a portion of the inactive surface of the semiconductor chip. A conductor pattern layer is embedded in the encapsulant such that one exposed surface of the conductor pattern layer is exposed from the encapsulant, and a metal layer is disposed on the encapsulant and covers the one exposed surface of the conductor pattern layer.

According to another aspect of the present disclosure, a semiconductor package includes a connection structure including one or more redistribution layers, a semiconductor chip disposed on the connection structure and having an active surface on which a connection pad electrically connected to the redistribution layer is disposed and an inactive surface opposite to the active surface, a first encapsulant disposed on the connection structure and covering at least a portion of the inactive surface of the semiconductor chip, and a second encapsulant disposed on the first encapsulant and covering the first encapsulant. A heat dissipating structure is disposed on the second encapsulant and at least partially embedded in the second encapsulant.

According to another aspect of the present disclosure, a semiconductor package includes a semiconductor chip having an active surface including a connection pad disposed thereon and an inactive surface opposite to the active surface, an encapsulant covering at least a portion of the inactive surface of the semiconductor chip, and a heat dissipating structure disposed on the encapsulant. A surface of the heat dissipating structure facing the encapsulant includes a plurality of conductor patterns protruding into the encapsulant.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
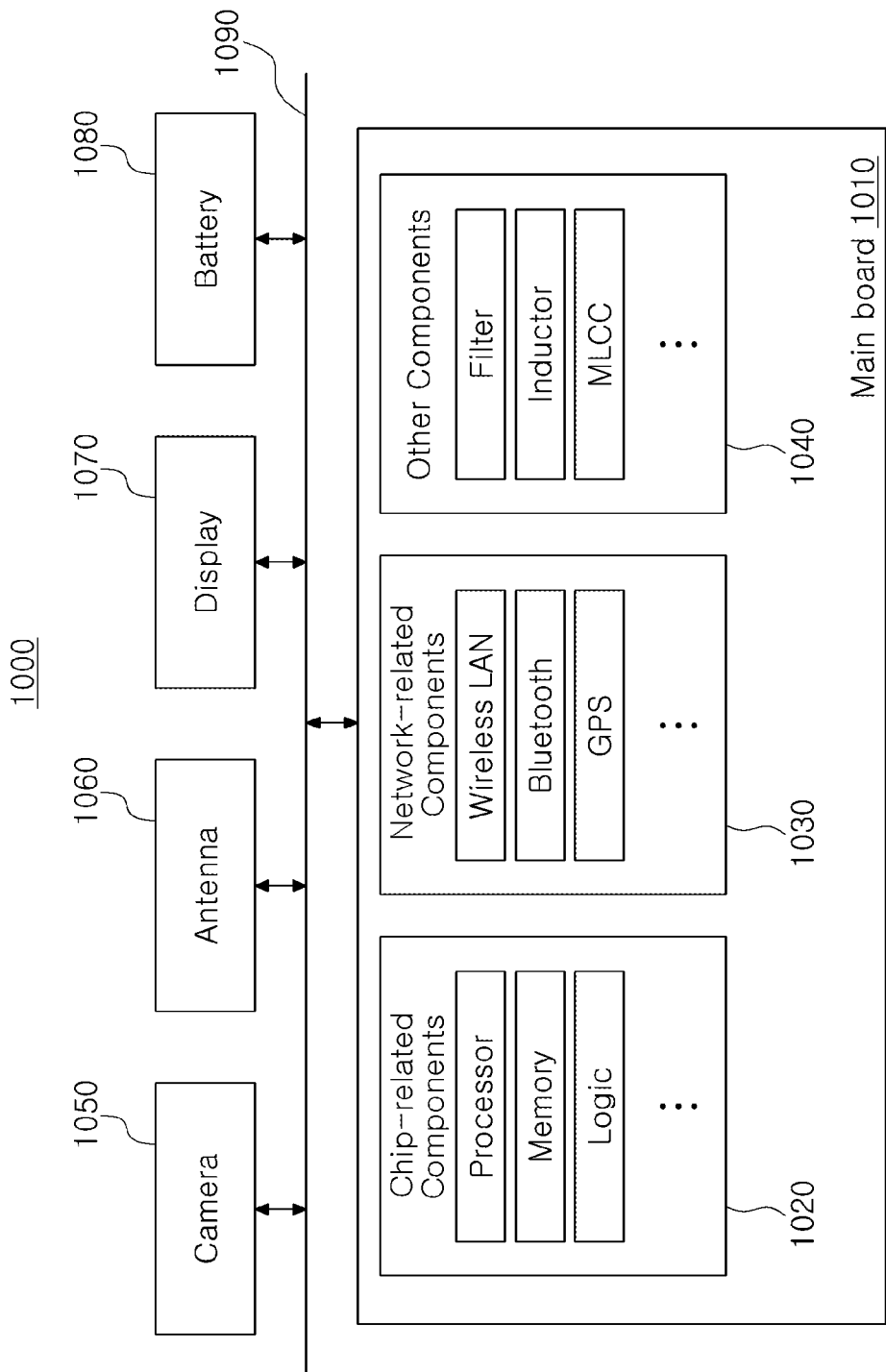
FIG. 1 is a schematic block diagram illustrating an example of an electronic device system.

Hereinafter, embodiments of the present disclosure will be described as follows with reference to the attached drawings. The shape and size of elements in the drawings may be exaggerated or reduced for clarity.

Electronic Device

FIG. 1 is a block diagram schematically illustrating an exemplary embodiment of an electronic device system.

Referring to the drawings, an electronic device 1000 may include a main board 1010. The main board 1010 may be physically and/or electrically connected to chip-related components 1020, network-related components 1030, and other components 1040. They may be also combined with other components to be described later by form various signal lines 1090.

The chip-related components 1020 may include a memory chip, such as a volatile memory (e.g., DRAM), a non-volatile memory (e.g., ROM), a flash memory, etc.; an application processor chip, such as a central processor (e.g., CPU), a graphics processor (e.g., GPU), a digital signal processor, a cryptographic processor, a microprocessor, a microcontroller, etc.; a logic chip, such as an analog-to-digital converter, an application-specific IC (ASICs), etc.; and the like, but are not limited thereto, and other types of chip-related components may be included. These chip-related components 1020 may be combined with each other.

The network-related components 1030 may include components designated to operate according to Wi-Fi (IEEE 802.11 family, etc.), WiMAX (IEEE 802.16 family, etc.), IEEE 802.20, long term evolution (LTE), Ev-DO, HSPA+, HSDPA+, HSUPA+, EDGE, GSM, GPS, GPRS, CDMA, TDMA, DECT, Bluetooth, 3G protocol, 4G protocol, 5G protocol, and any other wireless and wired protocols designated as the later ones, but are not limited thereto, and any of other various wireless or wired standards or protocols may be further included. The network-related components 1030 may be combined with the chip-related components 1020, as well.

Other components 1040 may include a high frequency inductor, a ferrite inductor, a power inductor, a ferrite bead, a low temperature co-firing ceramic (LTCC), an electromagnetic interference (EMI) filter, and a multilayer ceramic condenser (MLCC), but is not limited thereto, and may include other passive components used for various other purposes. Other components 1040 may be combined with each other, in addition to combining with the chip-related components 1020 and/or the network-related components 1030.

Depending on the type of the electronic device 1000, the electronic device 1000 may include other components that may or may not be physically and/or electrically connected to the main board 1010. Other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage device (e.g., a hard disk drive) (not illustrated), a compact disk (CD) diver (not illustrated), and a digital versatile disk (DVD) diver (not illustrated), and the like, but is not limited thereto, and other components used for various purposes may be included, depending on the type of the electronic device 1000.

The electronic device 1000 may be a smartphone, a personal digital assistant, a digital video camera, a digital still camera, a network system, a computer, a monitor, a tablet computer, a laptop computer, a netbook, a television, a video game, a smartwatch, an automotive components, and the like, but is not limited thereto, and may be any other electronic device that processes data.

Figure 2:
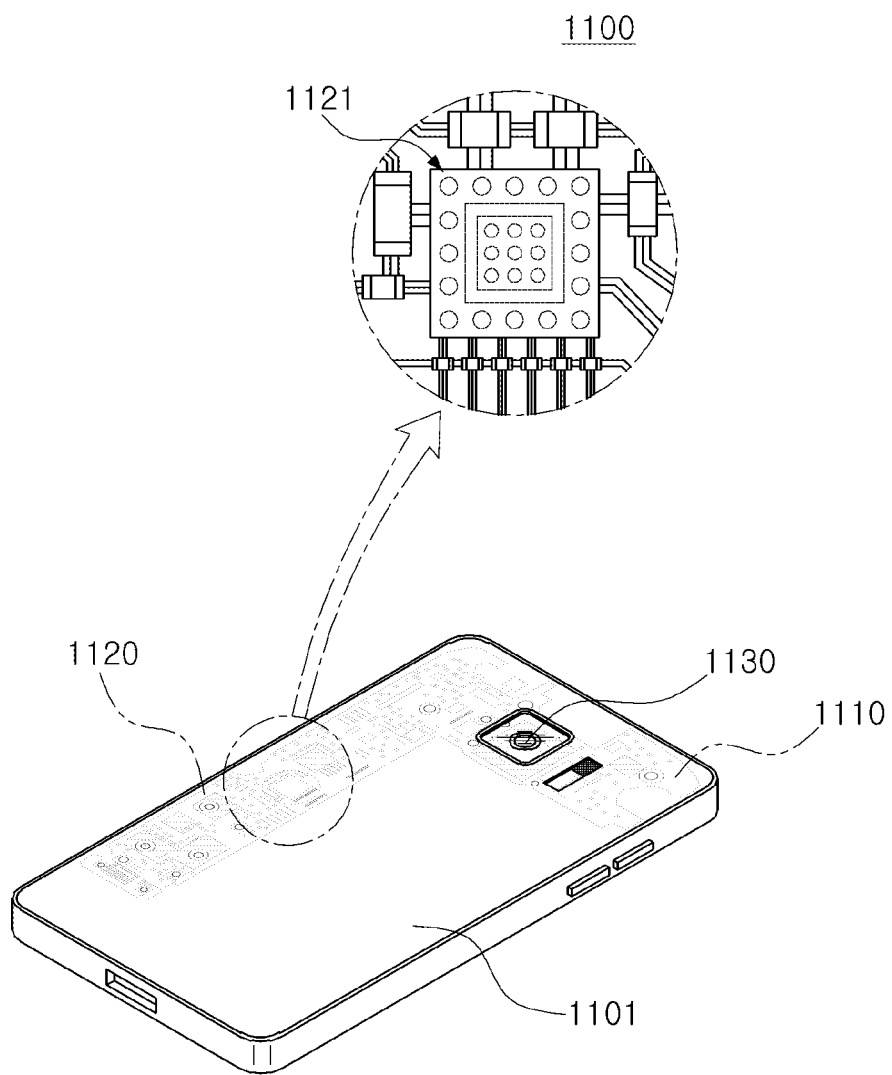
FIG. 2 is a schematic perspective view illustrating an example of an electronic device.

FIG. 2 is a perspective view schematically illustrating an exemplary embodiment of an electronic device.

Referring to the drawings, a semiconductor package may be applied to various electronic devices as described above for various purposes. For example, a printed circuit board 1110, such as a main board, may be included in a body 1101 of a smartphone 1100. Further, various components 1120 may be physically and/or electrically connected to the printed circuit board 1110. In addition, other components that may or may not be physically and/or electrically connected to the printed circuit board 1110, such as a camera 1130, may be housed within the body 1101. A portion of the components 1120 may be chip-related components, for example, but not limited to, a semiconductor package 1121. The electronic device is not necessarily limited to the smartphone 1100, and may be other electronic device as described above.

Semiconductor Package

In general, a semiconductor chip may have many microelectronic circuits integrated therein, but does not necessarily serve as a finished product of a semiconductor in itself, and the semiconductor chip may be damaged by an external physical or chemical impact. Therefore, the semiconductor chip itself may be not used as it is and may be packaged and used as an electronic device or the like in such a packaged state.

Semiconductor packaging may be used, for example in situations in which there is a difference in a circuit width between a semiconductor chip and a main board of the electronic device in view of an electrical connection. Specifically, for a semiconductor chip, the size of the connection pad and the interval between connection pads are very small and narrow, whereas the size of the component mounting pad and the interval between component mounting pads are much larger and wider than the scale of the semiconductor chip, respectively. Therefore, since it is difficult to directly mount a semiconductor chip on such a main board, there is a need for a packaging technique which may buffer the difference in a circuit width therebetween.

A semiconductor package manufactured by such a packaging technique may be classified as a fan-in semiconductor package and a fan-out semiconductor package, depending on the structure and use thereof.

Hereinafter, the fan-in semiconductor package and the fan-out semiconductor package will be described in more detail with reference to the drawings.

Fan-In Semiconductor Package

Figure 3A:
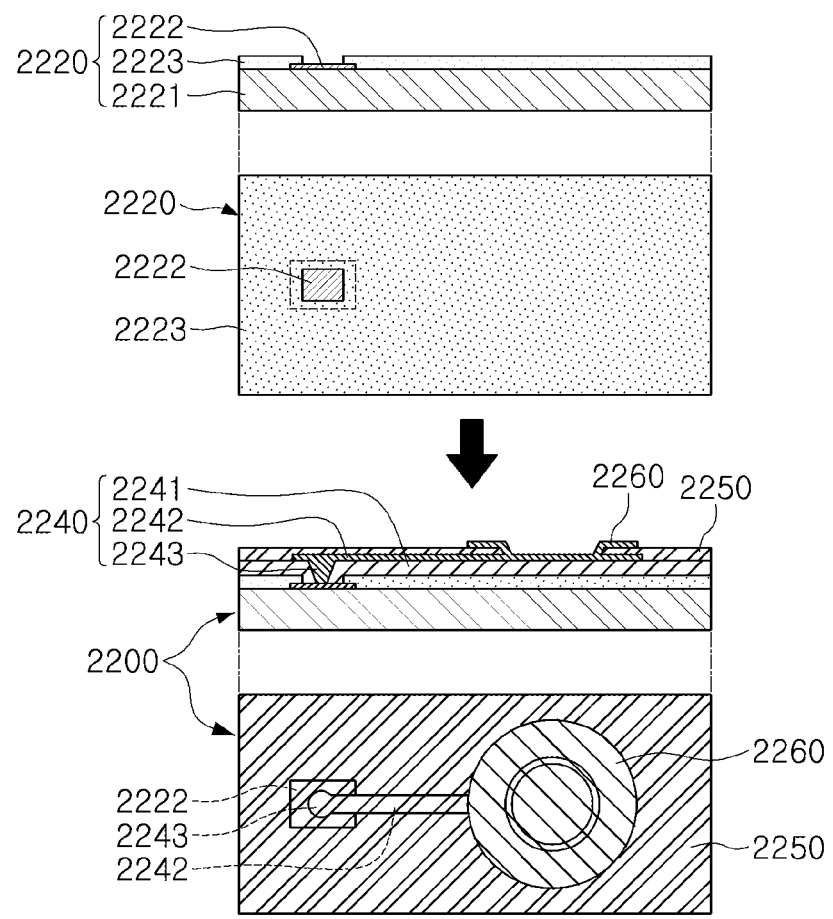
FIGS. 3A and 3B are schematic cross-sectional views illustrating states of a fan-in semiconductor package before and after being packaged.
Figure 3B:
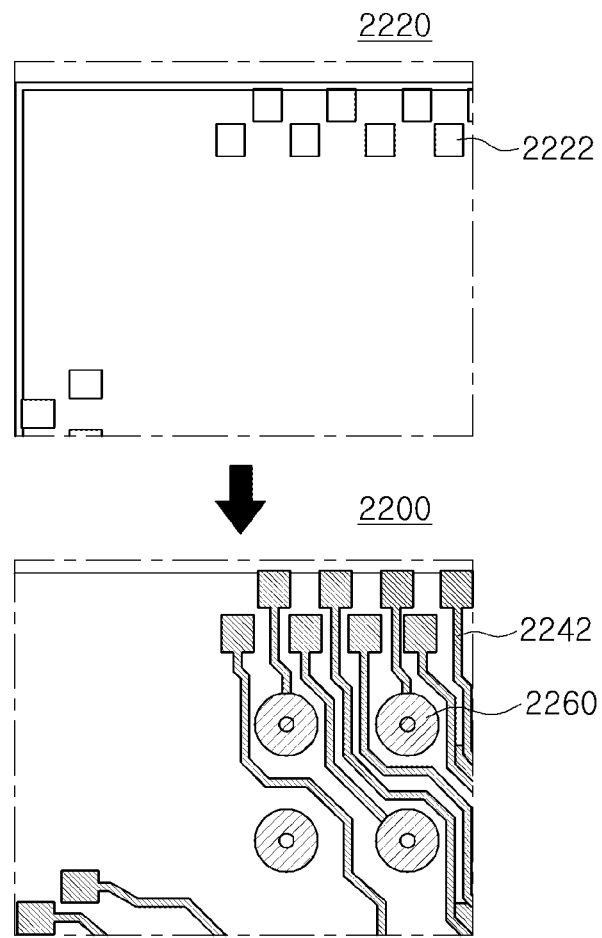

FIGS. 3A and 3B are cross-sectional views schematically illustrating states of a fan-in semiconductor package, before and after being packaged.

Figure 4:
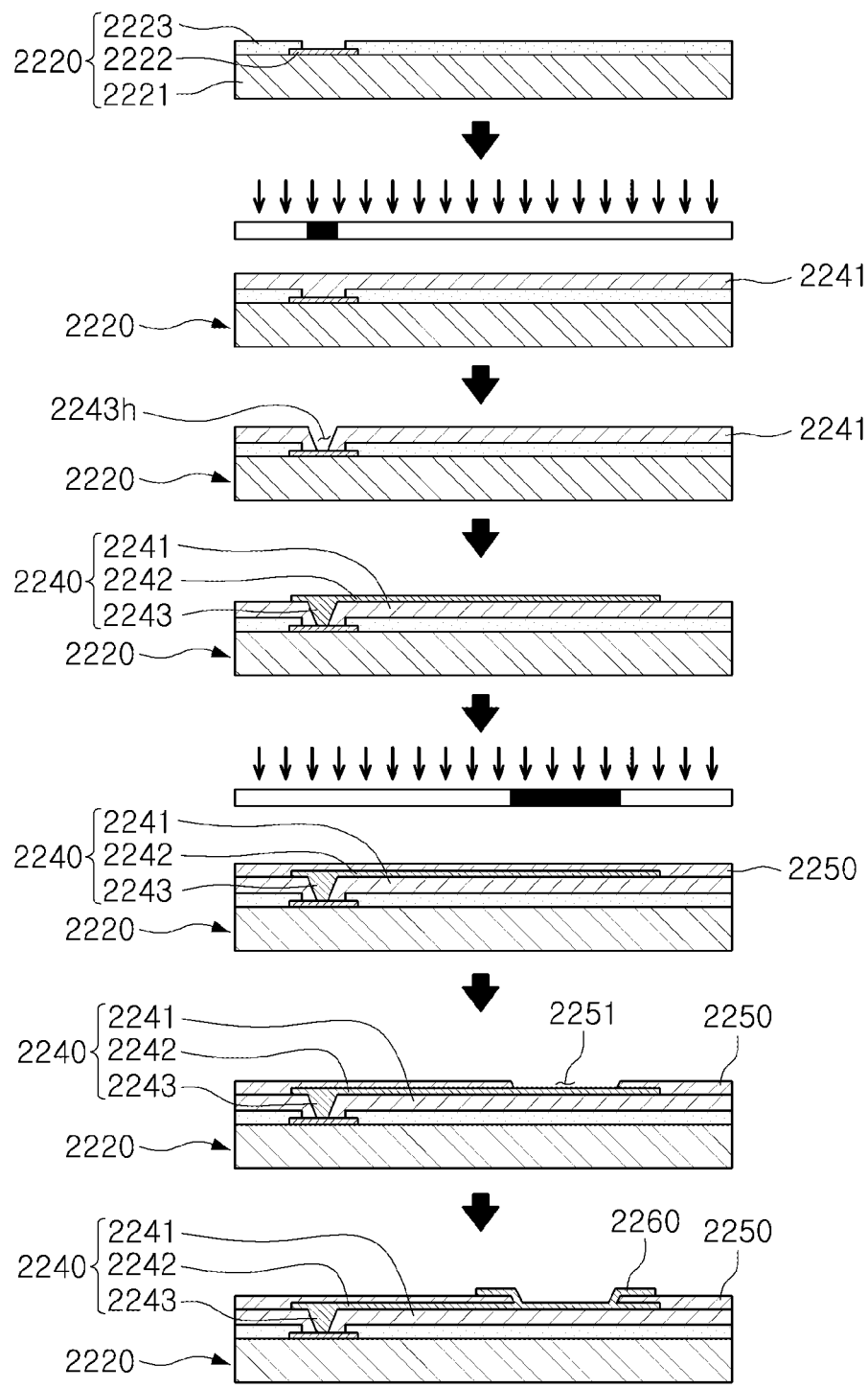
FIG. 4 is schematic cross-sectional views illustrating a packaging process of a fan-in semiconductor package.

FIG. 4 is a cross-sectional view schematically illustrating a packaging process of a fan-in semiconductor package.

Referring to the drawings, a semiconductor chip 2220 may be an integrated circuit (IC) in a bare state. A body 2221 may include silicon (Si), germanium (Ge), gallium arsenide (GaAs), or the like. A connection pad 2222 may include a conductive material, such as aluminum (Al) or the like, formed on one surface of the body 2221. A passivation film 2223, such as an oxide film, a nitride film, or the like, may be formed on one surface of the body 2221 and cover at least a portion of the connection pad 2222. At this time, since the connection pad 2222 is very small, it may be difficult to mount the integrated circuit (IC) even on a medium size level printed circuit board (PCB) as well as a main board of the electronic device.

A connection structure 2240 may be formed on the semiconductor chip 2220 in conformity with the size of the semiconductor chip 2220, to redistribute the connection pad 2222. The connection structure 2240 may be prepared by way of forming an insulation layer 2241 with an insulating material such as a photo-imageable dielectric (PID) resin on the semiconductor chip 2220, forming a via hole 2243h for opening the connection pad 2222, and forming a wiring pattern 2242 and a via 2243. Thereafter, a passivation layer 2250 for protecting the connection structure 2240 may be formed, an opening 2251 may be formed, and an under-bump metal layer 2260 or the like may be formed. For example, a fan-in semiconductor package 2200 including, for example, the semiconductor chip 2220, the connection structure 2240, the passivation layer 2250, and the under-bump metal layer 2260 may be formed through a series of processes.

As described above, the fan-in semiconductor package may be a package type in which all the connection pads of the semiconductor chip, for example, input/output (I/O) terminals are arranged inside the element. The fan-in semiconductor package may have good electrical characteristics, and may be produced at relatively low cost. Accordingly, many elements in a smartphone may be manufactured in the form of a fan-in semiconductor package. Specifically, it is being developed in a direction of achieving a small-sized form and realizing fast signal transmission at the same time.

Since, in the fan-in semiconductor package, all of the I/O terminals should be disposed inside the semiconductor chip, there may be many limitations in space. Therefore, such a structure may be difficult to apply to a semiconductor chip having a large number of I/O terminals or a semiconductor chip having a small size. In addition, due to this problem, the fan-in semiconductor package may not be directly mounted on and used in a main board of an electronic device. Even when the size and interval of the I/O terminals of the semiconductor chip are enlarged in a redistributing process, they do not have a size and an interval enough to be directly mounted on the main board of the electronic device.

Figure 5:
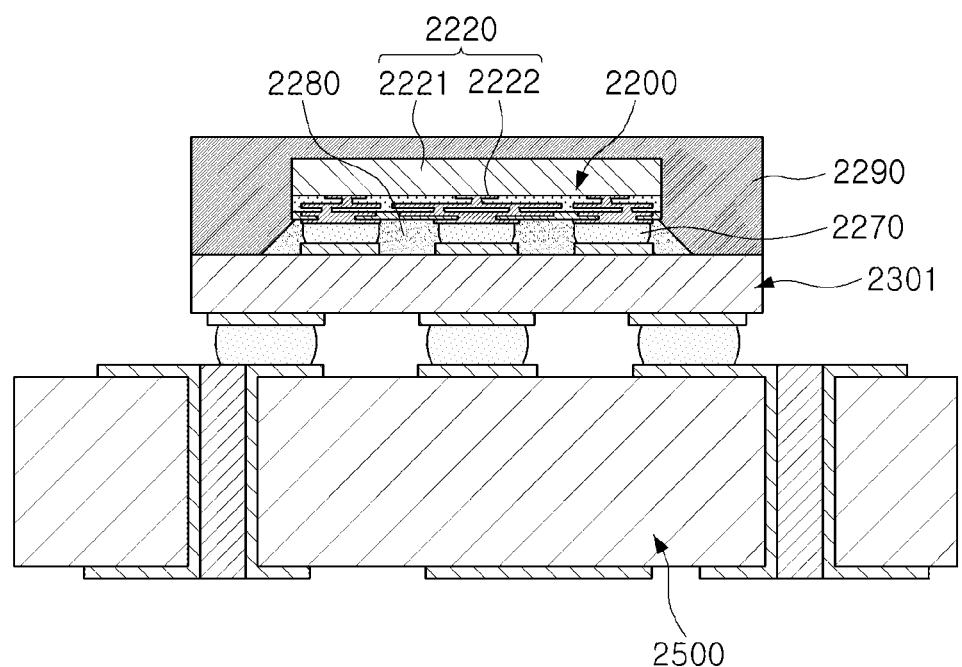
FIG. 5 is a schematic cross-sectional view illustrating a fan-in semiconductor package mounted on a printed circuit board and ultimately mounted on a mainboard of an electronic device.

FIG. 5 is a cross-sectional view schematically illustrating a fan-in semiconductor package mounted on a printed circuit board that is ultimately mounted on a main board of an electronic device.

Figure 6:
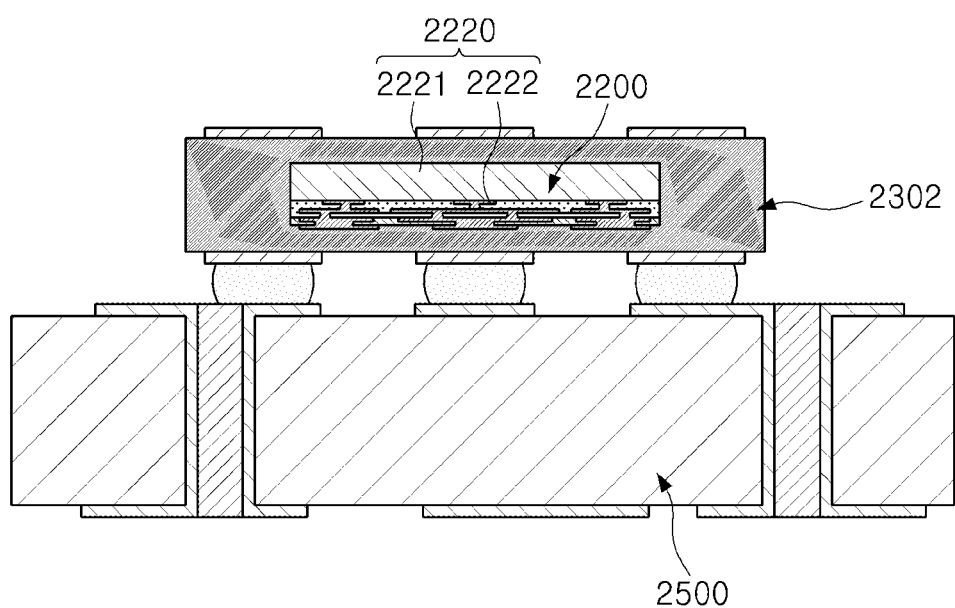
FIG. 6 is a schematic cross-sectional view illustrating a fan-in semiconductor package embedded in a printed circuit board and ultimately mounted on a mainboard of an electronic device.

FIG. 6 is a cross-sectional view schematically illustrating a fan-in semiconductor package embedded in a printed circuit board that is ultimately mounted on a main board of an electronic device.

Referring to the drawings, a fan-in semiconductor package 2200 may be configured such that connection pads 2222 of a semiconductor chip 2220, i.e. I/O terminals are redistributed once again through a printed circuit board 2301, and the fan-in semiconductor package 2200 mounted on the printed circuit board 2301 is mounted on a main board 2500 of an electronic device. At this time, a solder ball 2270 and the like may be fixed with an underfill resin 2280, and an outer side of the semiconductor chip 2220 may be covered with a molding material 2290 or the like. Alternatively, the fan-in semiconductor package 2200 may be embedded in a separate printed circuit board 2302, and the connection pads 2222 of the semiconductor chip 2220, i.e., the I/O terminals may be redistributed once again in an embedded form, and ultimately mounted on the main board 2500 of the electronic device.

As above, it may be difficult to directly mount the fan-in semiconductor package on the main board of the electronic device. Therefore, it may be mounted on a separate printed circuit board, and may be then mounted on the main board of the electronic device through a packaging process, or may be mounted on the main board of the electronic device in a form embedded in the printed circuit board.

Fan-Out Semiconductor Package

Figure 7:
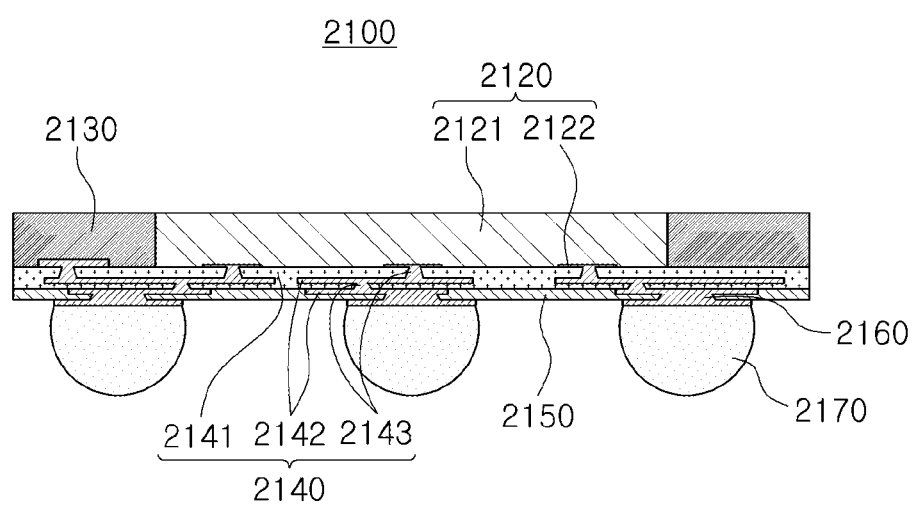
FIG. 7 is a schematic cross-sectional view illustrating a fan-out semiconductor package.

FIG. 7 is a cross-sectional view schematically illustrating a fan-out semiconductor package.

Referring to the drawings, in a fan-out semiconductor package 2100, for example, an outer side of a semiconductor chip 2120 may be protected by an encapsulant 2130, and connection pads 2122 of the semiconductor chip 2120 may be redistributed to the outer side of the semiconductor chip 2120 through a connection structure 2140. A passivation layer 2150 may be further formed on the connection structure 2140. An under-bump metal layer 2160 may be further formed on an opening of the passivation layer 2150. A solder ball 2170 may be further formed on the under-bump metal layer 2160. The semiconductor chip 2120 may be an integrated circuit (IC) including a body 2121, a connection pad 2122, and the like. The connection structure 2140 may include an insulation layer 2141, a wiring layer 2142 formed on the insulation layer 2241, and a via 2143 for electrically connecting the connection pad 2122 and the wiring layer 2142.

The fan-out semiconductor package may be formed by redistributing the I/O terminals to the outer side of the semiconductor chip through the connection structure formed on the semiconductor chip. As described above, in a fan-in semiconductor package, all of the I/O terminals of the semiconductor chip should be disposed inside of the semiconductor chip. When the size of the element is reduced, the size and pitch of the ball should be reduced. Therefore, the standardized ball layout may be not used. On the other hand, in a fan-out semiconductor package, the I/O terminals may be redistributed outward from the semiconductor chip through the connection structure formed on the semiconductor chip. Although the size of the semiconductor chip is reduced, the standardized ball layout may be used as it is. Therefore, the fan-out semiconductor package may be mounted on a main board of an electronic device without a separate printed circuit board, as described later.

Figure 8:
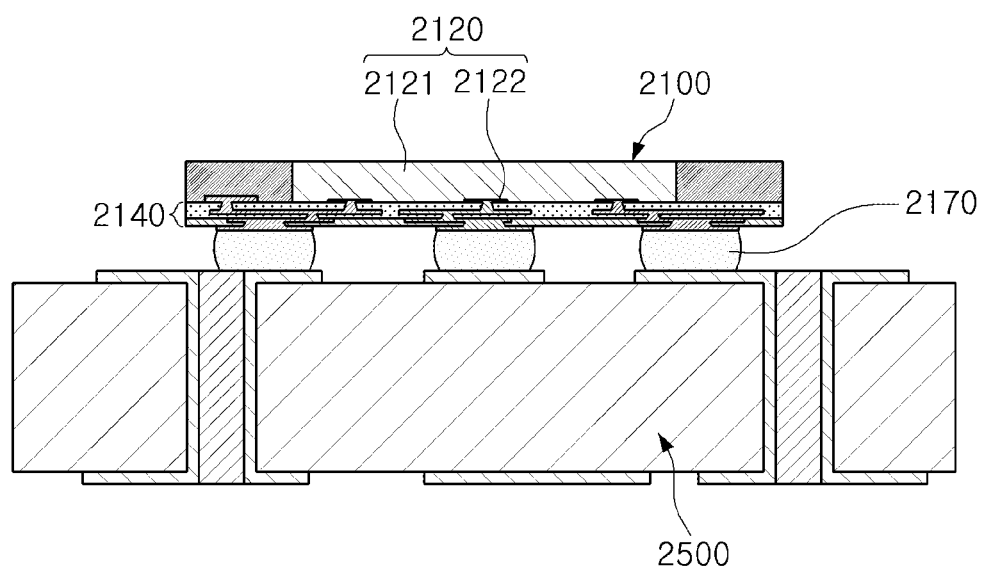
FIG. 8 is a schematic cross-sectional view illustrating a fan-out semiconductor package mounted on a mainboard of an electronic device.

FIG. 8 is a cross-sectional view schematically illustrating a fan-out semiconductor package mounted on a main board of an electronic device.

Referring to the drawings, a fan-out semiconductor package 2100 may be mounted on a main board 2500 of an electronic device through a solder ball 2170 or the like. For example, as described above, the fan-out semiconductor package 2100 may include a connection structure 2140 on the semiconductor chip 2120 that may redistribute connection pads 2122 to a fan-out area beyond a size of the semiconductor chip 2120. The standardized ball layout may be used as it is, and as a result, it may be mounted on the main board 2500 of the electronic device without a separate printed circuit board or the like.

Since the fan-out semiconductor package may be mounted on the main board of the electronic device without a separate printed circuit board, as above, the fan-out semiconductor package may be made thinner than the fan-in semiconductor package using the printed circuit board. Therefore, a downsizing and thinning in the fan-out semiconductor package may be accomplished. It may be also suitable for mobile products because of its excellent thermal and electrical properties. In addition, it may be implemented more compactly than a general package-on-package (POP) type using a printed circuit board (PCB), and a problem caused by a bending phenomenon may be prevented.

The fan-out semiconductor package may refer to a package technology for mounting the semiconductor chip on a main board of the electronic device, or the like, and for protecting the semiconductor chip from an external impact, and may have a concept different from a printed circuit board (PCB), such as a printed circuit board in which a fan-in semiconductor package is embedded, which are different from each other in view of scale, use, and the like.

Hereinafter, a semiconductor package having a novel structure, which significantly reduces a mounting area of a semiconductor chip and a passive component, significantly reduces an electrical path between a semiconductor chip and a passive component, significantly reduces process defects such as undulations and cracks, and, furthermore, easily connects electrodes of passive components to connection vias by a laser-via process or the like, may be described with reference to the drawings.

Figure 9:
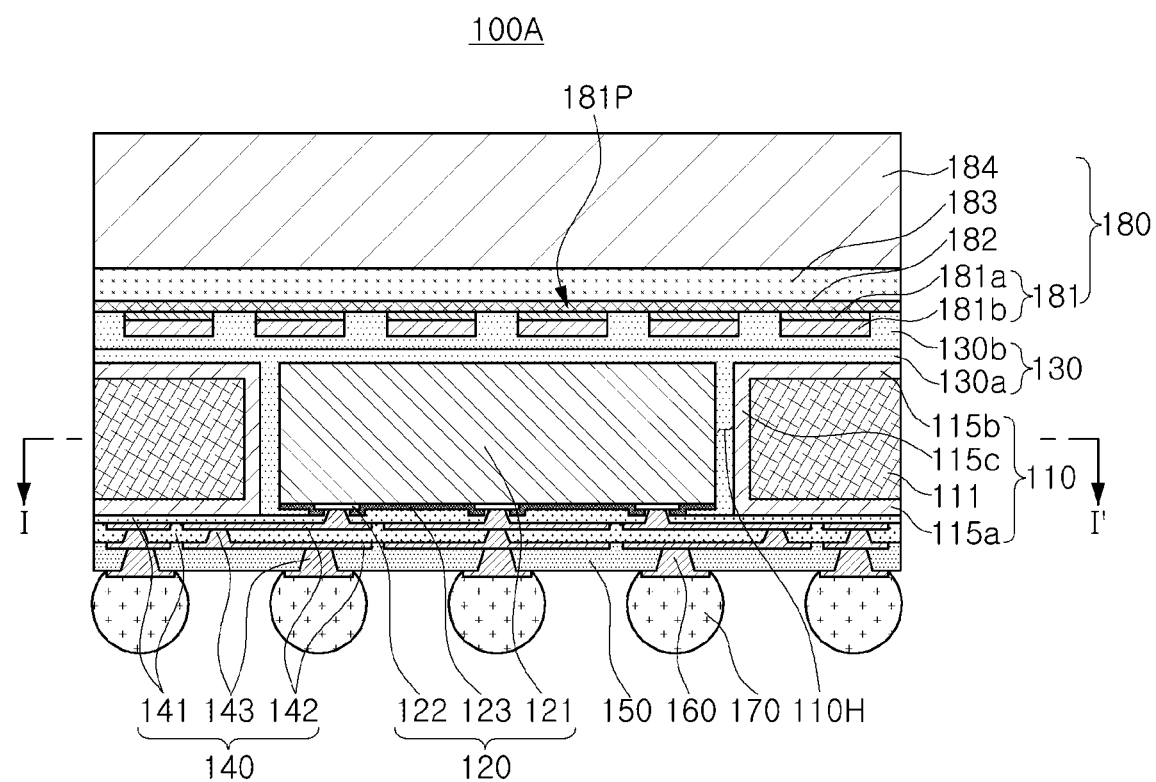
FIG. 9 is a schematic cross-sectional view illustrating an example of a semiconductor package.

FIG. 9 is a schematic cross-sectional view illustrating an example of a semiconductor package.

Figure 10:
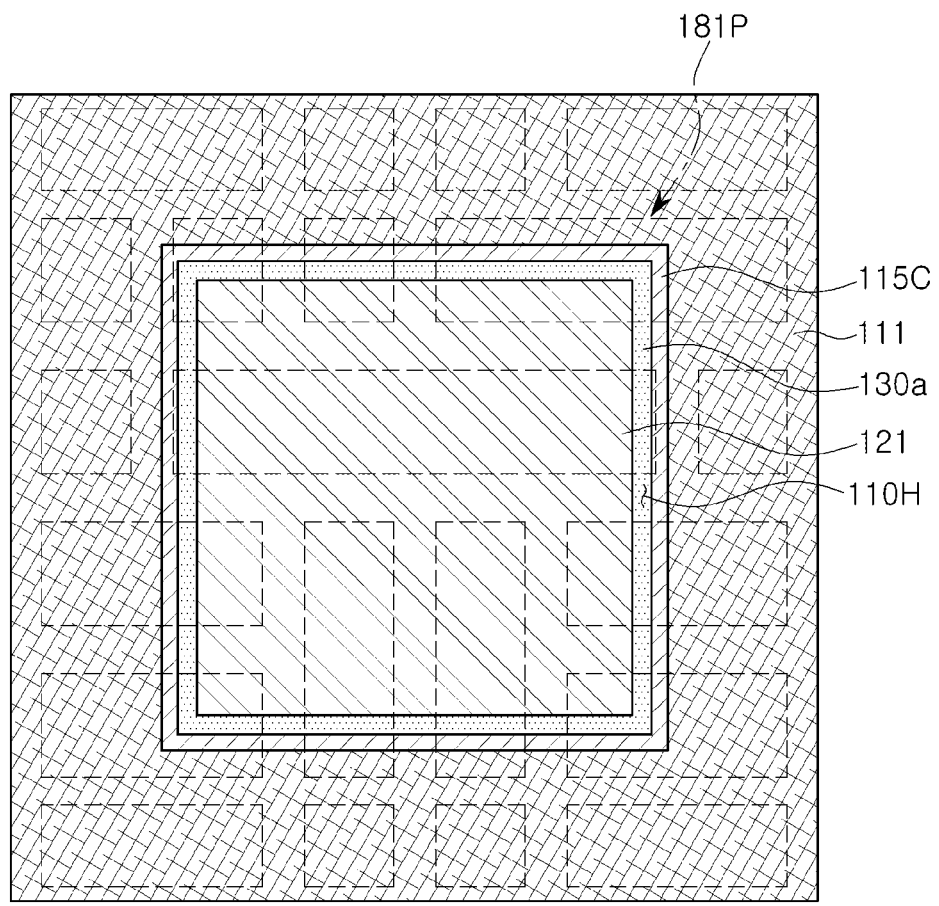
FIG. 10 is a schematic plan view of the semiconductor package of FIG. 9 taken along line I-I'.

FIG. 10 is a schematic plan view of the semiconductor package of FIG. 9 taken along line I-I'.

A semiconductor package 100A (may also be referred to package 100A or fan-out semiconductor package 100A) according to an example embodiment may include a connection structure 140 including one or more redistribution layers 142; a semiconductor chip 120 disposed on the connection structure 140 and having an active surface on which a connection pad 122 electrically connected to the redistribution layer 142 is disposed and an inactive surface opposite to the active surface; an encapsulant 130 disposed on the connection structure 140 and covering at least a portion of the inactive surface of the semiconductor chip 120; and a heat dissipating structure 180 disposed on the encapsulant 130 and at least partially embedded in the encapsulant 130. The heat dissipating structure 180 may include a conductor pattern layer 181 embedded in the encapsulant 130 such that one surface of the conductor pattern layer 181 is exposed from the encapsulant 130, and a metal layer 182 disposed on the encapsulant 130 and the one exposed surface of the conductor pattern layer 181. The heat dissipating structure 180 may further include a conductive adhesive 183 disposed on the metal layer 182 and a heat dissipating member 184 disposed on the conductive adhesive 183.

In recent years, as functions of a semiconductor chip have improved, it has become important to effectively release heat generated therefrom. For this purpose, conventionally, the generated heat has been dissipated in such a manner that a heat dissipating member, such as a metal plate, is simply attached to an upper portion of a semiconductor package with an adhesive, or a metal layer is simply plated. In this case, since a distance between the heat dissipating member and the semiconductor chip is considerable, there may be a problem in which it is difficult to obtain a sufficient heat dissipating effect. In addition, since the heat dissipating member may be formed on the semiconductor package having been already manufactured, when a defect occurs in a process of forming the heat dissipating member, the semiconductor chip should be also discarded, thereby reducing yield of the semiconductor chip manufacturing process. Particularly, when a heat dissipating member such as a metal plate is simply attached, adhesion with an encapsulant or a molding material may be low, which causes a problem of peeling-off risk.

A semiconductor package 100A according to an example embodiment may include a heat dissipating structure 180 disposed on an encapsulant 130 and at least partially embedded in the encapsulant 130. The heat dissipating structure 180 may include a conductor pattern layer 181 embedded in the encapsulant 130 such that one surface of the conductor pattern layer 181 is exposed from or through the encapsulant 130, and a metal layer 182 disposed on the encapsulant 130 and the one exposed surface of the conductor pattern layer 181. The embedded conductor pattern layer 181 may be closer to an inactive surface of a semiconductor chip 120 (e.g., closer to the inactive surface than to the active surface of the semiconductor chip 120), and may more reliably emit heat generated from the semiconductor chip 120 in an upward direction. The conductor pattern layer 181 may be embedded in the encapsulant 130 to have a good adhesion, and the metal layer 182 may be also formed to cover and contact the exposed surface of the conductor pattern layer 181 through the encapsulant 130 and the exposed surface of the encapsulant 130 through the conductor pattern layer 181, to have excellent adhesion.

The heat dissipating structure 180 may further include a conductive adhesive 183 disposed on the metal layer 182 and a heat dissipating member 184 disposed on the conductive adhesive 183 for better heat dissipation. In this case, since the conductive adhesive 183 is disposed on the metal layer 182 instead of the encapsulant 130 (which may be formed of an organic material), a better adhesion may be also exerted. Since a semiconductor package 100A according to an example embodiment has a special structure of a heat dissipating structure 180, both the heat dissipating effect and the reliability may be improved as compared with the conventional one. Further, by arranging such a metal material, it may also improve a warpage problem of the package 100A, and also have an electromagnetic wave shielding effect. The conductor pattern layer 181 and the metal layer 182 of the heat dissipating structure 180 may be separately manufactured using a carrier or the like, such that only a good product may be introduced into an upper portion of the package 100A. Therefore, the yield problem of the semiconductor chip 120 manufacturing process may be improved, and the entire process time of the product may be not affected.

The encapsulant 130 may include a first encapsulant 130a disposed on the connection structure 140 and covering at least a portion of the semiconductor chip 120 such as at least a portion of an inactive surface, and a second encapsulant 130b disposed on the first encapsulant 130a and covering the first encapsulant 130a. The first and second encapsulants 130a and 130b may be provided as distinct layers separate from each other. In this case, the conductor pattern layer 181 may be embedded in the second encapsulant 130b such that one exposed surface of the conductor pattern layer 181 is exposed from the second encapsulant 130b, and the metal layer 182 may be disposed on the second encapsulant 130b to cover the one exposed surface of the conductor pattern layer 181. The conductor pattern layer 181 and the metal layer 182 may be formed on the carrier, and then the conductor pattern layer 181 and the metal layer 182 may be introduced by laminating them on the first encapsulant 130a of the package 100A with coverage provided by the second encapsulant 130b. In this case, since the conductor pattern layer 181 is embedded in the second encapsulant 130b and the metal layer 182 covers the second encapsulant 130b in an uncured state of the second encapsulant 130b, an adhesion between heterogeneous materials may be improved to reduce the interfacial peeling-off risk. In addition, a connection of an insulation resin between the first and second encapsulants 130a and 130b may have a better adhesion effect, and may further improve the reliability of the package 100A.

The conductor pattern layer 181 may include a plurality of metal patterns 181P, and at least a portion of the plurality of metal patterns 181P may be spaced apart from each other and face the inactive surface of the semiconductor chip at a predetermined distance from the inactive surface of the semiconductor chip 120. In this case, adhesion may be improved through an embossing effect while maintaining an excellent heat dissipating effect. The metal layer 182 may have the form of a single metal plate to provide a flat surface. The metal layer 182 may extend across spaces between the metal patterns 181P of the conductor pattern layer 181, and may extend integrally across the inactive surface of the semiconductor chip 120. The metal layer 182 may contact the encapsulant 130 between the plurality of conductor patterns 181P. In this case, the adhesion reliability of the heat dissipating member 184 through the conductive adhesive 183 may be further improved. The conductive adhesive 183 may include a thermally conductive interface material (TIM), and the heat dissipating member 184 may include a metal lump. In this case, the heat dissipating effect may be maximized.

The conductor pattern layer 181 may include a first conductor layer 181a in contact with the metal layer 182 and embedded in the encapsulant 130 and a second conductor layer 181b disposed on the first conductor layer 181a and embedded in the encapsulant 130. The first conductor layer 181a may be a seed layer formed on one surface of the metal layer 182 on the carrier by an electroless plating process such as a metal sputter, or the like, and the second conductor layer 181b may be a plated layer formed by an electroplating process using the first conductor layer 181a as a seed layer. Therefore, a thickness of the second conductor layer 181b may be thicker than a thickness of the first conductor layer 181a. As described above, the conductor pattern layer 181 may be embedded in the encapsulant 130 in such a manner that the seed layer and the plated layer are reversed (e.g., the seed layer may be disposed above the plated layer when the package is disposed in the orientation shown in FIG. 9).

A semiconductor package 100A according to an example embodiment may further include a frame 110 disposed on the connection structure 140 and having a through-hole 110H. In this case, the semiconductor chip 120 may be disposed in the through-hole 110H such that the active surface thereof faces the connection structure 140, and the encapsulant 130, in particular, the first encapsulant 130a may cover or directly contact at least a portion of the frame 110, and may fill at least a portion of the through-hole 110H. When the frame 110 is provided, better rigidity may be introduced to the package and it may help to ensure thickness uniformity of the encapsulant 130, in particular, the first encapsulant 130a. The frame 110 may include an insulation layer 111 in which the through-hole 110H is formed, first and second metal layers 115a and 115b respectively disposed on opposing lower and upper surfaces of the insulation layer 111, and a third metal layer 115c disposed on a wall surface of the through-hole 110H. In this case, a better heat dissipating effect may be achieved. Further, the electromagnetic wave shielding effect and the warpage improving effect may be further enhanced.

A semiconductor package 100A according to an example embodiment may further include a passivation layer 150 disposed at a lower side of the connection structure 140 and having a plurality of openings for respectively opening or exposing at least a portion of a lowermost redistribution layer 142 among the redistribution layers 142, a plurality of under-bump metals 160 disposed on or in the plurality of openings and electrically connected to the lowermost redistribution layer 142, and a plurality of electrical connection metals 170 disposed at a lower side of the passivation layer 150 and electrically connected to the plurality of under-bump metals 160, as shown.

Hereinafter, each configuration included in a semiconductor package 100A according to one example will be described in more detail.

The frame 110 may further improve rigidity of the package 100A according to a specific material of the insulation layer 111, and may play a role of ensuring thickness uniformity of the first encapsulant 130a. The frame 110 may have a through-hole 110H passing through the insulation layer 111. The semiconductor chip 120 may be disposed in the through-hole 110H, and passive components (not illustrated) may be disposed together (e.g., in the through-hole 110H having the semiconductor chip 120, or in a different through-hole in the frame 110), as needed. The through-hole 110H may have a wall surface surrounding the semiconductor chip 120, but the present disclosure is not limited thereto. Metal layers 115a, 115b, and 115c may be disposed on lower and upper surfaces of the insulation layer 111 and a wall surface of the through-hole 110H, respectively, and may be connected to or directly contact each other. The metal layers 115a, 115b, and 115c may have a better heat dissipation effect, and the electromagnetic wave shielding effect and warpage improving effect may be further enhanced.

A material of the insulation layer 111 is not particularly limited. For example, an insulating material may be used. As the insulating material, a thermosetting resin such as an epoxy resin, a thermoplastic resin such as polyimide, or a resin in which these resins are mixed with an inorganic filler, for example, ABF (Ajinomoto Build-up Film), or the like, may be used. Alternatively, a material in which the above-mentioned resin, impregnated in a core material such as glass fiber, glass cloth, glass fabric, or the like, together with an inorganic filler, for example, a prepreg, or the like, may be used.

The metal layers 115a, 115b, and 115c may be formed of a metal material such as copper (Cu), aluminum (Al), silver (Ag), tin (Sn), gold (Au), nickel (Ni), lead (Pb), titanium (Ti), alloys thereof, and the like. The metal layers 115a, 115b, and 115c may be electrically connected to a ground pattern and/or a power pattern of the redistribution layer 142, as needed, to perform a function of a ground pattern and/or a power pattern.

The semiconductor chip 120 may be an integrated circuit (IC) in which hundreds to millions of devices are integrated into one chip. In this case, the integrated circuit may be an application processor chip, such as a central processor (e.g., CPU), a graphics processor (e.g., GPU), a digital signal processor, a cryptographic processor, a microprocessor, and the like, but is not limited thereto, may be a power management IC (PMIC), or may be a memory chip such as a volatile memory (for example, a dynamic random access memory (DRAM)), a non-volatile memory (for example, a read only memory (ROM)), a flash memory, or the like; a logic chip such as an analog-to-digital converter, an application-specific IC (ASIC), or the like.

The semiconductor chip 120 may be an integrated circuit in a bare state in which no separate bump or wiring layer is formed. The present disclosure is not limited thereto, and may be a packaged type integrated circuit, as needed. The integrated circuit may be formed based on an active wafer. In this case, silicon (Si), germanium (Ge), gallium arsenide (GaAs), or the like may be used as a base material of a body 121 of the semiconductor chip 120. Various circuits may be formed in the body 121. The connection pad 122 may be used to electrically connect the semiconductor chip 120 to other components, and a conductive material such as aluminum (Al) may be used as a formation material thereof without any particular limitation. A passivation film 123 exposing the connection pad 122 may be formed on the body 121. The passivation film 123 may be an oxide film or a nitride film, or may be a double layer of an oxide film and a nitride film. An insulating film (not illustrated) or the like may be further disposed in other appropriate positions. Meanwhile, in the semiconductor chip 120, a surface on which the connection pad 122 is disposed may become an active surface, and a surface opposite thereto may become an inactive surface. At this time, when the passivation film 123 is formed on the active surface of the semiconductor chip 120, the active surface of the semiconductor chip 120 may determine a positional relationship based on the lowermost surface of the passivation film 123.

The first encapsulant 130a may encapsulate the frame 110 and the semiconductor chip 120, and may also fill at least a portion of the through-hole 110H. The first encapsulant 130a may include an insulating material. Examples of the insulating material may include such as a thermosetting resin such as an epoxy resin, a thermoplastic resin such as polyimide, or a resin including the above materials with a reinforcing material such as an inorganic filler, specifically ABF, FR-4, BTresin, etc. In addition, a known molding material such as EMC may be used. Further, a photosensitive material, for example, a photo imageable encapsulant (PIE) may be used as needed. A material in which an insulating resin such as a thermosetting resin or a thermoplastic resin impregnated with a core material such as an inorganic filler and/or glass fiber, glass cloth, glass fabric, or the like, may be used, as needed.

The second encapsulant 130b may further provide an insulation layer on a backside of the package 100A and may embed the conductor pattern layer 181 therein. The second encapsulant 130b also may include an insulating material. Examples of the insulating material may include such as a thermosetting resin such as an epoxy resin, a thermoplastic resin such as polyimide, or a resin including the above materials with a reinforcing material such as an inorganic filler, specifically ABF, FR-4, BTresin, etc. Further, a photosensitive material, for example, a photo-imageable dielectric (PID) material may be used as needed. A material in which an insulating resin such as a thermosetting resin or a thermoplastic resin impregnated with a core material such as an inorganic filler and/or glass fiber, glass cloth, glass fabric, or the like, may be used, as needed. The second encapsulant 130b may be formed of the same material as the first encapsulant 130a, or may be formed of different material. The first and second encapsulants 130a and 130b may be provided as distinct layers separated from each other, and may be separated from each other.

The connection structure 140 may redistribute the connection pad 122 of the semiconductor chip 120. Several tens to hundreds of the connection pads 122 having various functions of semiconductor chips 120 may be redistributed through the connection structure 140. The connection pads 122 may be physically and/or may be electrically connected externally, in accordance with functions thereof, through the electrical connection metal 170. The connection structure 140 may include an insulation layer 141, a redistribution layer 142 disposed on the insulation layer 141, and a connection via 143 passing through the insulation layer 141 and electrically connecting the connecting pad 122 and the redistribution layer 142. The number of insulation layer, redistribution layer, connection via and connection pad may be more or less than those shown in the drawings.

As the material of the insulation layer 141, an insulating material may be used. In this case, a photo-imageable dielectric (PID) material may be used as an insulating material. In this case, a fine pitch may be introduced through the photo-via process. Tens to hundreds of the connection pads 122 in the semiconductor chip 120 may be redistributed very effectively as in the conventional case. Multiple insulation layers 141 may be bounded to each other, or the boundaries therebetween may be unclear.

The redistribution layers 142 may be redistributed to electrically connect the connection pads 122 of the semiconductor chip 120 to the electrical connection metals 170. As a material for forming the redistribution layers 142, a metal material such as copper (Cu), aluminum (Al), silver (Ag), tin (Sn), gold (Au), nickel (Ni), lead (Pb), titanium (Ti), or alloys thereof may be used. The redistribution layers 142 may also perform various functions, depending on a desired design. For example, a ground (GND) pattern, a power (PWR) pattern, a signal (S) pattern, and the like, may be included. The ground (GND) pattern and the power (PWR) pattern may be the same pattern. In addition, the redistribution layer 142 may include various types of via pads, electrical connection metal pads, and the like. The redistribution layers 142 may be formed by a plating process, and may include a seed layer and a conductor layer.

The connection vias 143 may electrically connect the redistribution layers 142 formed on different layers, and may electrically connect the connection pads 122 of the semiconductor chip 120 to the redistribution layers 142. The connection vias 143 may be in physical contact with the connection pads 122, when the semiconductor chip 120 is a bare die. As the material for forming the connection vias 143, a metal material, such as copper (Cu), aluminum (Al), silver (Ag), tin (Sn), gold (Au), nickel (Ni), lead (Pb), titanium (Ti), or alloys thereof may be used. The connection vias 143 may include a signal via, a power via, a ground via, etc. The power via and ground via may be the same via. The connection vias 143 may also be a filled type via filled with a metal material, or may be a conformal type via in which a metal material formed along a wall surface of a via hole. Further, it may have a tapered shape. The connection vias 143 may also be formed using a plating process, and may be composed of a seed layer and a conductor layer.

The passivation layer 150 may be an additional structure for protecting the connection structure 140 from external physical or chemical damage, or the like. The passivation layer 150 may include a thermosetting resin. For example, the passivation layer 150 may be ABF, but is not limited thereto. The passivation layer 150 may have openings for opening or exposing at least a portion of the lowermost redistribution layer 142 among the redistribution layers 142. The number of openings may be in the range of tens to tens of thousands, or more or less. Each of the openings may be formed of a plurality of holes. A surface mounting component such as a capacitor may be disposed on the lower surface of the passivation layer 150 to be electrically connected to the redistribution layer 142, and as a result, may be electrically connected to the semiconductor chip 120. Although not shown in the drawing, a separate surface mounting component (not illustrated) such as a capacitor may be further disposed on the lower surface of the passivation layer 150, and may be electrically connected to the connection pad 122 through the redistribution layer 142.

The under-bump metal 160 may also be an additional component, which improves the connection reliability of the electrical connection metal 170, and thus improve the board level reliability of a fan-out semiconductor package 100A according to one example. The under-bump metal 160 may be provided in the number of tens to tens of thousands, and may be provided in numbers more or less than that. Each under-bump metal 160 may be electrically connected to the open lowermost redistribution layer 142 formed at the opening of the passivation layer 150. The under-bump metal 160 may be formed by a known metallization method using a known conductive material, for example, metal, but is not limited thereto.

The electrical connection metal 170 may also be an additional component, a configuration for physically and/or electrically connecting a semiconductor package 100A externally. For example, the semiconductor package 100A may be mounted on the main board of the electronic device through the electrical connection metal 170. The electrical connection metal 170 may be disposed on the passivation layer 150, and may be electrically connected to the under-bump metal 160, respectively. The electrical connection metal 170 may be composed of a low melting point metal, for example, tin (Sn), or an alloy including tin (Sn). More specifically, it may be formed of a solder or the like, but this may be merely an example embodiment, and the material is not particularly limited thereto.

The electrical connection metal 170 may be a land, a solder ball, a pin, or the like. The electrical connection metal 170 may be formed of multiple layers or a single layer. In a case of being formed of multiple layers, it may include a copper pillar and a solder. In a case of being formed of a single layer, tin-silver solder or copper may be included, but this may be merely an example and is not limited thereto. The number, interval, arrangement type, etc., of the electrical connection metal 170 are not particularly limited, and may be sufficiently modified, depending on a design specification by a skilled artisan. For example, the number of electrical connection metal 170 may be in the range of tens to thousands, depending on the number of connection pads 122, and may be more or less than the above range.

At least one of the electrical connection metals 170 may be disposed in a fan-out area. The fan-out area may be an area, except for those in which the semiconductor chip 120 is disposed (e.g., an area outside of a zone of overlap with the semiconductor chip 120). The fan-out package may be more reliable than the fan-in package, may have many I/O terminals, and may facilitate 3D interconnection. In addition, a package thinner than a ball grid array (BGA) package, a land grid array (LGA) package, and the like, may be manufactured, and may be excellent in price competitiveness.

The conductor pattern layer 181 may be embedded in the second encapsulant 130b to provide a plurality of metal patterns 181P capable of performing a heat dissipating function to the backside of the package 100A. The conductor pattern layer 181 may also include conductive materials, such as copper (Cu), aluminum (Al), silver (Ag), tin (Sn), gold (Au), nickel (Ni), lead (Pb), titanium (Ti), or alloys thereof. The conductor pattern layer 181 may be formed by a known plating process, and may include a first conductor layer 181a, a seed layer, and a second conductor layer 181b, a plated layer. The conductor pattern layer 181 may be formed relatively thick to narrow a distance from the inactive surface of the semiconductor chip 120. For example, a thickness of the conductor pattern layer 181 may be greater than a thickness of each of the redistribution layers 142.

The metal layer 182 may be disposed on the second encapsulant 130b to provide a metal plate capable of performing a heat dissipating function to the backside of the package 100A. The metal layer 182 may also include conductive materials, such as copper (Cu), aluminum (Al), silver (Ag), tin (Sn), gold (Au), nickel (Ni), lead (Pb), titanium (Ti), or alloys thereof. The metal layer 182 may entirely cover the upper surface of the second encapsulant 130b and the upper surface of the exposed conductor pattern layer 181.

The conductive adhesive 183 may be any material that is heat transferable, regardless of a type of the material, and may include, for example, a thermally conductive interfacial material (TIM). The heat dissipating member 184 may also be any material that has a heat dissipating effect, and may include, for example, a metal lump, more particularly a copper lump. The heat dissipating member 184 may be thicker than a thickness of the conductive adhesive 183, a thickness of the metal layer 182, and a thickness of the conductor pattern layer 181 for an excellent heat dissipating effect.

Figure 11:
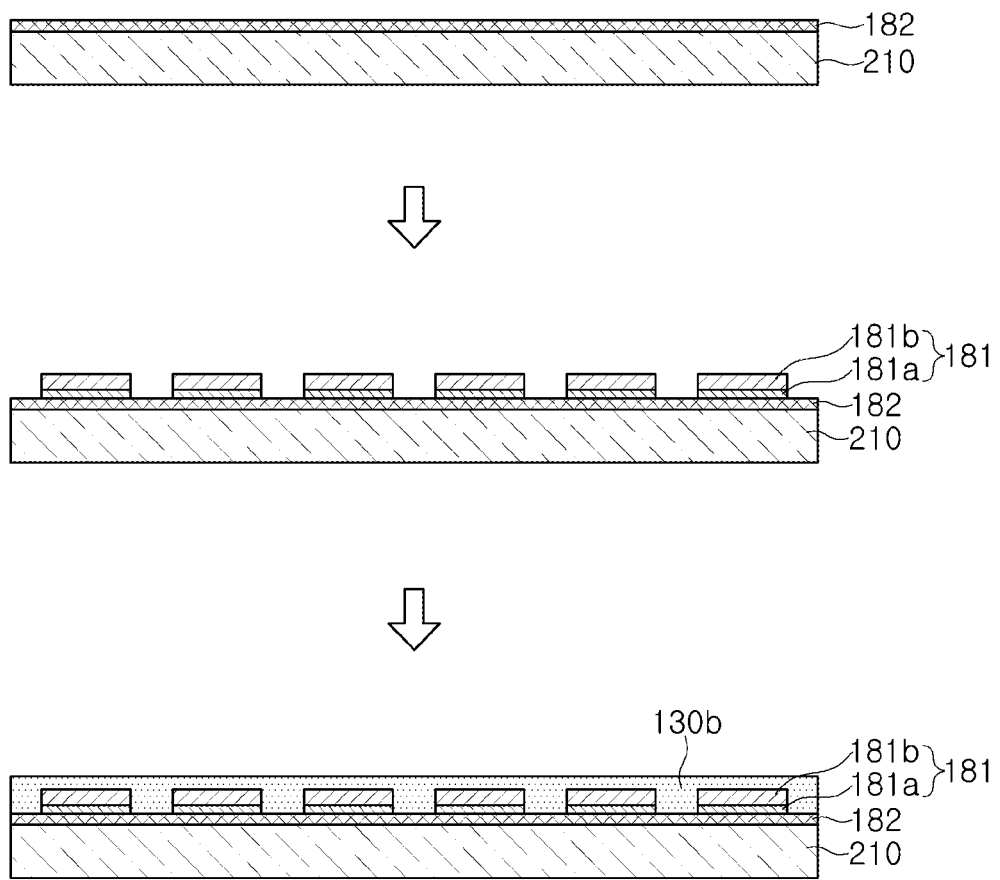
FIGS. 11, 12, and 13 are schematic views illustrating an example manufacturing procedure of the semiconductor package of FIG. 9.
Figure 12:
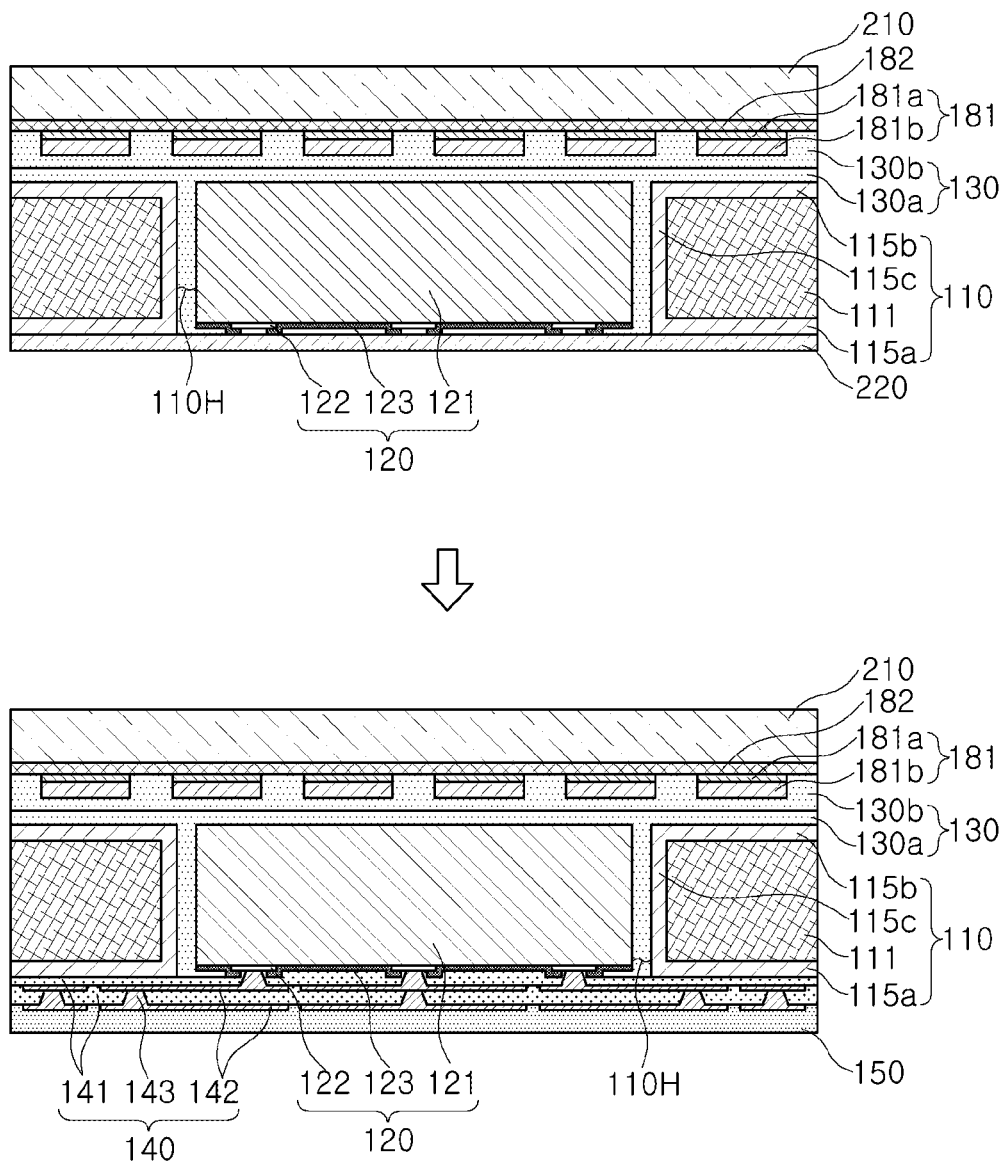
Figure 13:
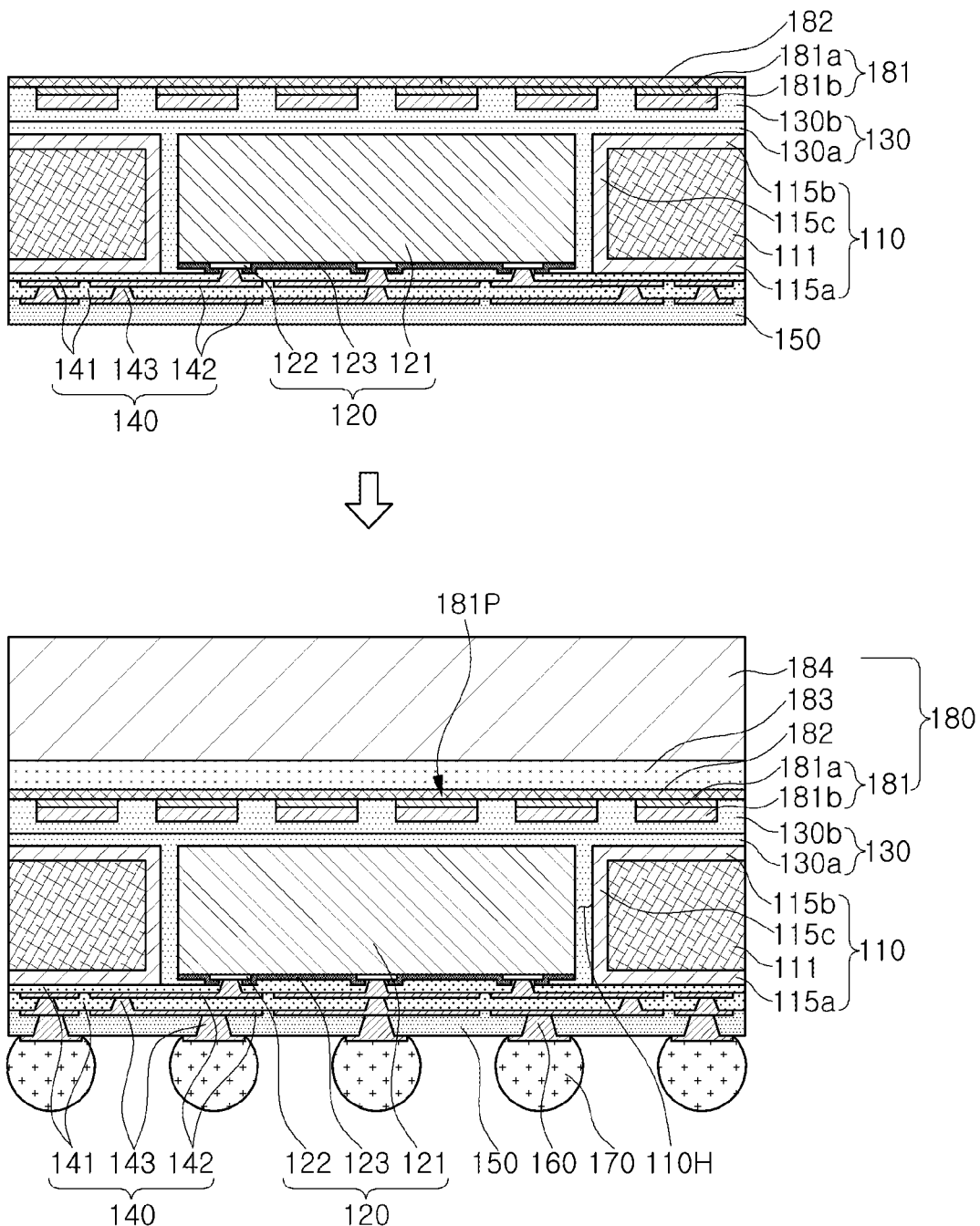

FIGS. 11 to 13 are schematic views illustrating an example of a manufacturing procedure of the semiconductor package of FIG. 9.

Referring to FIG. 11, first, a carrier 210 having a metal layer 182 formed on at least one surface thereof may be prepared. The carrier 210 may include a release layer (not illustrated) disposed between the carrier 210 and the metal layer 182 for easier peeling at an interface with the metal layer 182. Next, a conductor pattern layer 181 may be formed on the metal layer 182 using a plating process. The conductor pattern layer 181 may be formed by way of forming a first conductor layer 181a as a seed layer by an electroless plating process such as a metal sputtering, and forming a second conductor layer 181b as a substantial plated layer on the first conductor layer 181a by an electrolytic plating process. As a plating method used, an additive process (AP), a semi-AP (SAP), a modified SAP (MSAP), a tenting process, and the like, may be used. Next, ABF or the like in an uncured state may be stacked on the metal layer 182, such that the conductor pattern layer 181 may be embedded in the ABF or the like, and cured to form a second encapsulant 130b. The curing process may proceed with a first encapsulant 130a later.

Referring to FIG. 12, a frame 110 including an insulation layer 111 having a through-hole 110H and metal layers 115a, 115b, and 115c may be attached on a tape 220. A semiconductor chip 120 formed of a body 121, a connection pad 122, a passivation film 123, and the like, may be disposed in the through-hole 110H and may be attached to the tape 220 in a face-down manner. An ABF or the like in an uncured state may be used to cover the frame 110 and the semiconductor chip 120 on the tape 220 and to form the first encapsulant 130a filling the through-hole 110H. The first encapsulant 130a may be cured. Thereafter, the metal layer 182 and the conductor pattern layer 181 covered with the second encapsulant 130b separately manufactured may be laminated such that the first encapsulant 130a and the second encapsulant 130b are connected to each other. The first encapsulant 130a may be cured together with the second encapsulant 130b after the lamination.

Next, the tape 220 may be removed, and an insulation layer 141 may be formed by applying and hardening a PID or the like to an area from which the tape 220 has been removed. After a via hole is formed by a photolithography process, an operation of forming a redistribution layer 142 and a connection via 143 may be repeated one, two, or more times to form a connection structure 140. In addition, a passivation layer 150 may be formed using ABF or the like, as needed, and one or more openings may be formed in the passivation layer 150, and a plurality of under-bump metals 160 may be formed by filling the openings in a plating process (referring to FIG. 13).

Referring to FIG. 13, the carrier 210 may be then peeled off from the metal layer 182. Next, a conductive adhesive 183 may be formed on the metal layer 182 using a thermally conductive interfacial material (TIM) or the like, and a heat dissipating member 184 such as a metal lump may be attached through the conductive adhesive 183. As needed, an electrical connection metal 170 connected to the under-bump metal 160 may be formed on the passivation layer 150, and may be then reflowed to manufacture the semiconductor package 100A according to the above-described example.

Figure 14:
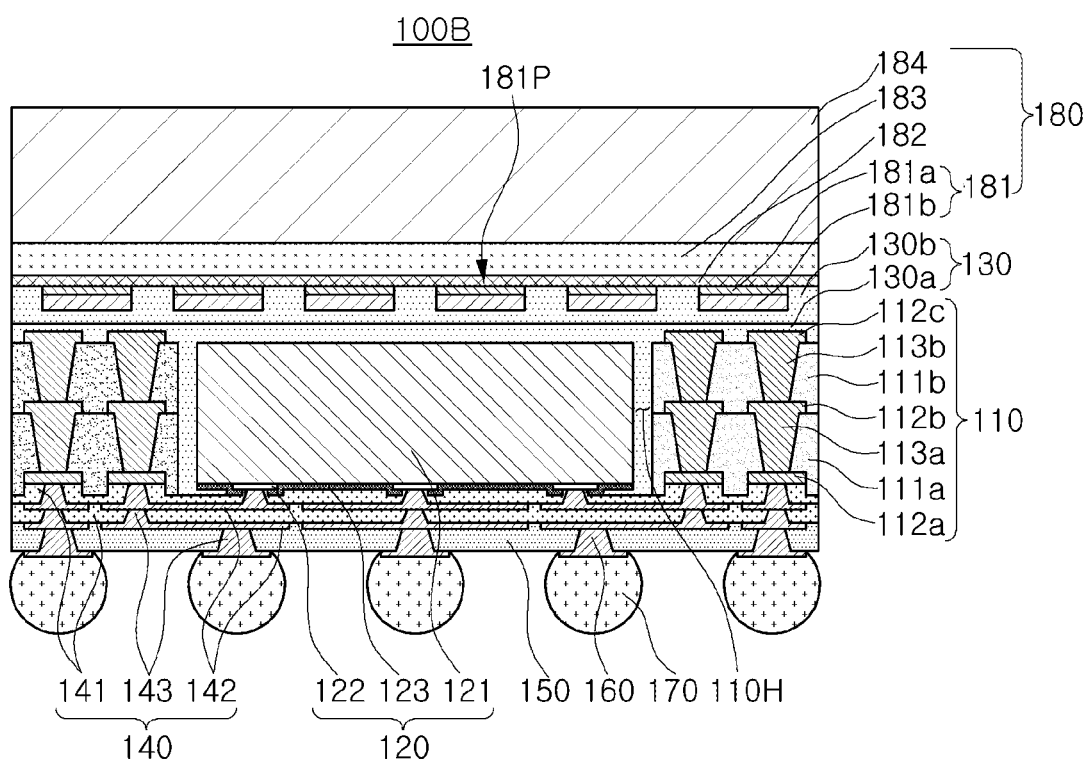
FIG. 14 schematically illustrates another example of a fan-out semiconductor package.

FIG. 14 schematically illustrates another example of a fan-out semiconductor package.

Referring to the drawings, a semiconductor package 100B according to another example may have a configuration different from the frame 110 in the semiconductor package 100A according to the above-described example. For example, a frame 110 may include a first insulation layer 111a in contact with a connection structure 140, a first wiring layer 112a in contact with the connection structure 140 and embedded in the first insulation layer 111a, a second wiring layer 112b disposed on a side of the first insulation layer 111a opposite to a side on which the first wiring layer 112a is disposed, a second insulation layer 111b disposed on the first insulation layer 111a and covering the second wiring layer 112b, and a third wiring layer 112c disposed on a side of the second insulation layer 111b opposite to a side in which the second wiring layer 112b is embedded. The first and second wiring layers 112a and 112b and the second and third wiring layers 112b and 112c may be electrically connected to first and second wiring vias 113a and 113b through the first and second insulation layers 111a and 111b, respectively. The first to third wiring layers 112a to 112c may be electrically connected to a connection pad 122, in accordance with functions thereof, through a redistribution layer 142 and a connection via 143. The frame 110 may be used as a vertical electrical connection path having the wiring layers 112a, 112b, and 112c, and design of the redistribution layer 142 of the connection structure 140 may be simplified to facilitate a thinning thereof. Further, the yield problem of the semiconductor chip 120 due to defects occurring in the process of forming the connection structure 140 may be improved.

The material of the insulation layers 111a and 111b is not particularly limited. For example, an insulating material may be used. As the insulating material, a thermosetting resin such as an epoxy resin, a thermoplastic resin such as polyimide, or a mixture of these resins with an inorganic filler, or a resin in which the above resins are impregnated with an inorganic filler such as silica into a core material, such as a glass fiber, a glass cloth, or a glass fabric, for example, a prepreg, may be used.

The wiring layers 112a, 112b, and 112c together with the wiring vias 113a and 113b may provide a vertical electrical connection path for the package and may perform the role of redistributing the connection pad 122. As a material for forming the wiring layers 112a, 112b, and 112c, a metal material such as copper (Cu), aluminum (Al), silver (Ag), tin (Sn), gold (Au), nickel (Ni), lead (Pb), titanium (Ti), or alloys thereof may be used. The wiring layers 112a, 112b, and 112c may perform various functions, depending on a desired design of the layer. For example, a ground (GND) pattern, a power (PWR) pattern, a signal (S) pattern, and the like, may be included. Here, the signal (S) pattern may include various signal patterns except for a ground (GND) pattern, a power (PWR) pattern, and the like, for example, a data signal pattern and the like. The ground (GND) pattern and the power (PWR) pattern may be the same pattern. The wiring layers 112a, 112b, and 112c may include various types of via pads and the like. The wiring layers 112a, 112b, and 112c may be formed by a known plating process, and may be composed of a seed layer and a conductor layer, respectively.

A thickness of each of the wiring layers 112a, 112b, and 112c may be thicker than a thickness of each of the redistribution layers 142. For example, the frame 110 may have a thickness equal to or greater than a thickness of the semiconductor chip 120. In order to maintain rigidity, prepregs and the like may be selected as the material of the insulation layers 111a and 111b, and wiring layers 112a, 112b, and 112c may be relatively thick. The connection structure 140 may provide a microcircuit and a high-density design. Therefore, a PID or the like may be selected as the material of the insulation layer 141, and a thickness of the redistribution layer 142 obtained therefrom may be relatively thin.

The first wiring layer 112a may be recessed into the first insulation layer 111a. In this way, in a case in which the first wiring layer 112a is recessed into the first insulation layer 111a to have a step difference between a lower surface of the first insulation layer 111a in contact with the connection structure 140 and a lower surface of the first wiring layer 112a in contact with the connection structure 140, when the semiconductor chip 120 and the frame 110 are encapsulated with the first encapsulant 130a, the forming material (e.g., the material used to form the first encapsulant 130a) may be prevented from bleeding to contaminate the first wiring layer 112a and/or to contaminate a contact between the first wiring layer 112a and the redistribution layers 142.

The wiring vias 113a and 113b may electrically connect the wiring layers 112a, 112b, and 112c formed on different layers, thereby forming an electrical path in the frame 110. As the material for forming the wiring vias 113a and 113b, a metal material, such as copper (Cu), aluminum (Al), silver (Ag), tin (Sn), gold (Au), nickel (Ni), lead (Pb), titanium (Ti), or alloys thereof may be used. The wiring vias 113a and 113b may include a signal via, a power via, a ground via, etc. The power via and ground via may be the same via. The wiring vias 113a and 113b may also be a filled type via filled with a metal material, or may be a conformal type via in which a metal material formed along a wall surface of a via hole. Further, they may each have a tapered shape. The wiring vias 113a and 113b may also be formed by a plating process, and may be composed of a seed layer and a conductor layer.

A portion of the pads of the first wiring layer 112a may serve as a stopper, when a hole for the first wiring via 113a is formed. The first wiring via 113a may have a tapered shape in which the width of the upper surface of the first wiring via 113a is wider than the width of the lower surface thereof in terms of the process. In this case, the first wiring via 113a may be integrated with the pad pattern of the second wiring layer 112b. When a hole for the second wiring via 113b is formed, a portion of the pads of the second wiring layer 112b may serve as stoppers. The second wiring via 113b may have a tapered shape in which the width of the upper surface of the second wiring via 113b is wider than the width of the lower surface thereof in terms of the process. In this case, the second wiring via 113b may be integrated with the pad pattern of the third wiring layer 112c.

Although not illustrated in the drawing, a metal layer (not illustrated) may be disposed on a wall surface of the through-hole 110H of the frame 110 for the purpose of shielding electromagnetic waves or for dissipating heat, and the metal layer (not illustrated) may surround the semiconductor chip 120.

Other details may be substantially the same as those described above in relation to the semiconductor package 100A according to the above-described example, and a detailed description thereof will be omitted.

Figure 15:
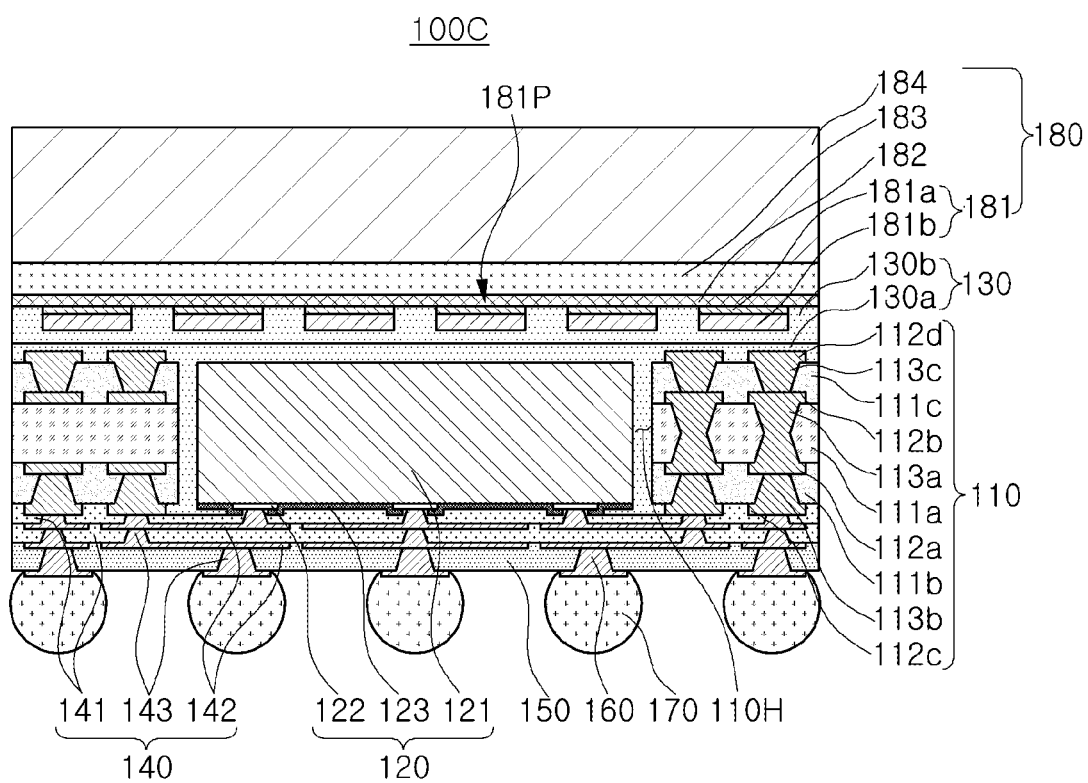
FIG. 15 schematically illustrates another example of a fan-out semiconductor package.

FIG. 15 schematically illustrates another example of a fan-out semiconductor package.

Referring to the drawings, a semiconductor package 100C according to another example may have a configuration different from the frame 110 in the semiconductor package 100A according to the above-described example. For example, the frame 110 may include a first insulation layer 111a, a first wiring layer 112a and a second wiring layer 112b respectively disposed on opposing lower and upper surfaces of the first insulation layer 111a, a second insulation layer 111b and a third insulation layer 111c respectively disposed on opposing lower and upper sides of the first insulation layer 111a and respectively covering the first and second wiring layers 112a and 112b, a third wiring layer 112c disposed on a lower side of the second insulation layer 111b opposite to a side in which the first wiring layer 112a is embedded, a fourth wiring layer 112d disposed on an upper side of the third insulation layer 111c opposite to a side in which the second wiring layer 112b is embedded, a first wiring via 113a passing through the first insulation layer 111a and electrically connecting the first and second wiring layers 112a and 112b, a second wiring via 113b passing through the second insulation layer 111b and electrically connecting the first and third wiring layers 112a and 112c, and a third wiring via 113c passing through the third insulation layer 111c and electrically connecting the second and fourth wiring layers 112b and 112d. The first to fourth wiring layers 112a, 112b, 112c, and 112d may be electrically connected to the connection pad 122 through the redistribution layer 142. Since the frame 110 has a relative large number of wiring layers 112a, 112b, 112c, and 112d, the connection structure 140 may be further simplified.

The first insulation layer 111a may be thicker than the second insulation layer 111b and the third insulation layer 111c. The first insulation layer 111a may be relatively thick to maintain rigidity and the second insulation layer 111b and the third insulation layer 111c may be introduced to have a relative larger number of wiring layers. In a similar manner, the first wiring via 113a passing through the first insulation layer 111a may be greater in height and average diameter than the second and third wiring vias 113b and 113c passing through the second and third insulating layers 111b and 111c. Further, the first wiring via 113a may have an hourglass or cylindrical shape, while the second and third wiring vias 113b and 113c may have tapered shapes opposite to each other. The thickness of each of the wiring layers 112a, 112b, 112c, and 112d may be thicker than the thickness of the redistribution layer 142 (e.g., thicker than the thickness of wiring layers provided within the redistribution layer 142).

Other details may be substantially the same as those described in relation to the semiconductor package 100A according to one example described above and the semiconductor package 100B according to another example described above, and a detailed description thereof will be omitted.

In the present disclosure, the words lower, lower portion, lower surface, and the like are used to refer to the downward direction (in the vertical direction of the drawings, also referred to as the thickness direction) with respect to the cross section of the drawing for convenience, while the words upper, upper portion, upper surface, and the like are used to refer to a direction opposite thereto. It should be understood that the definitions refer to directions for convenience of explanation, that the scope of the claims is not particularly limited by the description of such directions, and that the concepts of the upward/downward directions may be changed at any time.

The term of "connect" or "connection" in the present disclosure may be not only a direct connection, but also a concept including an indirect connection through an adhesive layer or the like. In addition, the term "electrically connected" or "electrical connection" means a concept including both a physical connection and a physical non-connection. Also, the expressions of "first," "second," etc. are used to distinguish one component from another, and do not limit the order and/or importance of the components. In some cases, without departing from the spirit of the invention, the first component may be referred to as a second component, and similarly, the second component may be referred to as a first component.

The expression "an example embodiment" used in the present disclosure do not all refer to the same embodiment, but may be provided for emphasizing and explaining different unique features. However, the above-mentioned example embodiments do not exclude that they can be implemented in combination with the features of other example embodiments. For example, although the description in the specific example embodiment may not be described in another example embodiment, it may be understood as an explanation related to another example embodiment, unless otherwise described or contradicted by the other example embodiment.

The terms used in the present disclosure are used only to illustrate an example embodiment, and are not intended to limit the present disclosure. At this time, the singular expressions include plural expressions unless the context clearly dictates otherwise.

As one of the various effects of the present disclosure, there may be provided a semiconductor package which has excellent heat dissipation characteristics and reliability as well as warpage control, electromagnetic shielding effect, and improved yield of a semiconductor chip by introducing a heat-dissipating structure.

While example embodiments have been shown and described above, it will be apparent to those skilled in the art that modifications and variations could be made without departing from the scope of the present disclosure as defined by the appended claims.

What is claimed is:

1. A semiconductor package comprising:
   a connection structure including one or more redistribution layers;
   a semiconductor chip disposed on the connection structure and having an active surface on which a connection pad electrically connected to at least one of the one or more redistribution layers is disposed and an inactive surface opposite to the active surface;
   an encapsulant disposed on the connection structure and covering at least a portion of the inactive surface of the semiconductor chip;
   a conductor pattern layer embedded in the encapsulant such that one exposed surface of the conductor pattern layer is exposed from the encapsulant; and
   a metal layer disposed on the encapsulant and covering the one exposed surface of the conductor pattern layer, wherein a thickness of the conductor pattern layer is thicker than a thickness of each of the one or more redistribution layers.

2. The semiconductor package according to claim 1, wherein the encapsulant comprises a first encapsulant disposed on the connection structure and covering at least a portion of the semiconductor chip, and a second encapsulant disposed on the first encapsulant,
wherein the first and second encapsulants are provided as distinct layers separate from each other.

3. The semiconductor package according to claim 2, wherein the conductor pattern layer is embedded in the second encapsulant such that the one exposed surface of the conductor pattern layer is exposed from the second encapsulant, and
the metal layer is disposed on the second encapsulant to cover and contact the one exposed surface of the conductor pattern layer and the second encapsulant.

4. The semiconductor package according to claim 1, wherein the conductor pattern layer comprises a plurality of metal patterns spaced apart from each other, and
the metal layer has the form of a metal plate extending across spaces between the metal patterns of the conductor pattern layer.

5. The semiconductor package according to claim 4, wherein at least a portion of the plurality of metal patterns is disposed to face the inactive surface of the semiconductor chip at a predetermined distance from the inactive surface of the semiconductor chip.

6. The semiconductor package according to claim 1, further comprising:
a conductive adhesive disposed on the metal layer; and
a heat dissipating member disposed on the conductive adhesive.

7. The semiconductor package according to claim 6, wherein the conductive adhesive comprises a thermally conductive interface material (TIM), and
the heat dissipating member comprises a metal lump.

8. The semiconductor package according to claim 1, wherein the conductor pattern layer comprises a first conductor layer in contact with the metal layer and embedded in the encapsulant, and a second conductor layer disposed on the first conductor layer and embedded in the encapsulant,
wherein a thickness of the second conductor layer is greater than a thickness of the first conductor layer.

9. The semiconductor package according to claim 1, further comprising a frame disposed on the connection structure and having a through-hole,
wherein the semiconductor chip is disposed in the through-hole such that the active surface thereof faces the connection structure, and
the encapsulant covers at least a portion of the frame, and fills at least a portion of the through-hole.

10. The semiconductor package according to claim 9, wherein the frame comprises an insulation layer in which the through-hole is formed, first and second metal layers respectively disposed on opposing surfaces of the insulation layer, and a third metal layer disposed on a wall surface of the through-hole.

11. The semiconductor package according to claim 9, wherein the frame comprises a first insulation layer in contact with the connection structure, a first wiring layer in contact with the connection structure and embedded in the first insulation layer, a second wiring layer disposed on a side of the first insulation layer opposite to a side on which the first wiring layer is disposed, a second insulation layer disposed on the first insulation layer and covering the second wiring layer, and a third wiring layer disposed on a side of the second insulation layer opposite to a side in which the second wiring layer is embedded,
wherein the first to third wiring layers are electrically connected to the connection pad.

12. The semiconductor package according to claim 9, wherein the frame comprises a first insulation layer, first and second wiring layers respectively disposed on opposing surfaces of the first insulation layer, second and third insulation layers respectively disposed on the opposing surfaces of the first insulation layer and respectively covering the first and second wiring layers, a third wiring layer disposed on a side of the second insulation layer opposite to a side in which the first wiring layer is embedded, and a fourth wiring layer disposed on a side of the third insulation layer opposite to a side in which the second wiring layer is embedded,
wherein the first to fourth wiring layers are electrically connected to the connection pad.

13. The semiconductor package according to claim 1, wherein the semiconductor package is a fan-out semiconductor package.

14. A semiconductor package comprising:
a semiconductor chip having an active surface including a connection pad disposed thereon and an inactive surface opposite to the active surface;
an encapsulant covering at least a portion of the inactive surface of the semiconductor chip; and
a heat dissipating structure disposed on the encapsulant,
wherein a surface of the heat dissipating structure facing the encapsulant includes a plurality of conductor patterns protruding into the encapsulant,
wherein the heat dissipating structure comprises a metal layer having one surface facing the semiconductor chip and extending integrally across the inactive surface of the semiconductor chip,
wherein the plurality of conductor patterns protrude from the one surface of the metal layer into the encapsulant, and
wherein each conductor pattern of the plurality of conductor patterns includes a seed layer disposed on the one surface of the metal layer to protrude into the encapsulant, and a plating layer disposed on the seed layer to protrude into the encapsulant and having a thickness larger than that of the seed layer.

15. The semiconductor package of claim 14, wherein the metal layer contacts the encapsulant between the plurality of conductor patterns.

* * * * *